United States Patent
Kang (10) Patent No.: US 9,651,634 B2
(45) Date of Patent: May 16, 2017

(54) BRAKE MASTER CYLINDER FOR STABLY DETECTING MAGNETIC FLUX DENSITY

(71) Applicant: Mando Corporation, Pyeongtaek-si, Gyeonggi-do (KR)

(72) Inventor: Dong Koo Kang, Seoul (KR)

(73) Assignee: MANDO CORPORATION, Pyeongtaek-si, Gyeonggi-do (KR)

( * ) Notice: Subject to any disclaimer, the term of this patent is extended or adjusted under 35 U.S.C. 154(b) by 31 days.

(21) Appl. No.: 14/882,341

(22) Filed: Oct. 13, 2015

(65) Prior Publication Data

US 2016/0101723 A1    Apr. 14, 2016

(30) Foreign Application Priority Data

Oct. 13, 2014  (KR) .................. 10-2014-0137628

(51) Int. Cl.

| *G01R 33/07* | (2006.01) |
|---|---|
| *G01B 7/14* | (2006.01) |
| *B60T 11/16* | (2006.01) |
| *B60T 11/20* | (2006.01) |

(52) U.S. Cl.
CPC .............. *G01R 33/07* (2013.01); *B60T 11/16* (2013.01); *B60T 11/20* (2013.01)

(58) Field of Classification Search
CPC .......... B60T 11/16; B60T 11/20; G01R 33/07; B60Q 1/441; B60Q 1/44; G01B 7/14; G01B 7/30
USPC .......................................... 324/207.2, 207.24
See application file for complete search history.

(56) References Cited

U.S. PATENT DOCUMENTS

| 5,002,090 | A | * | 3/1991 | Ichikawa | .................. G01F 1/24 137/550 |
|---|---|---|---|---|---|
| 7,280,937 | B1 | * | 10/2007 | Greer | ......................... C23C 8/80 324/207.11 |
| 2003/0000375 | A1 | * | 1/2003 | Zumberge | ............. B60T 8/4081 92/5 R |
| 2009/0027044 | A1 | * | 1/2009 | Hornung | ................ G01D 5/145 324/207.2 |
| 2015/0192152 | A1 | * | 7/2015 | Kageyama | ............. G01D 5/145 324/207.12 |
| 2016/0368415 | A1 | * | 12/2016 | Shiwa | ..................... B60T 11/20 |

FOREIGN PATENT DOCUMENTS

| DE | WO 2014076190 A3 | * | 9/2014 | ............. B60T 7/042 |
|---|---|---|---|---|
| FR | 2 885 108 | * | 11/2006 | ............. B60T 17/22 |

* cited by examiner

*Primary Examiner* — Jay Patidar
(74) *Attorney, Agent, or Firm* — McDermott Will & Emery LLP (57) ABSTRACT

A brake master cylinder includes a BLS module to control the switching on of a brake lamp according to an operation of a piston provided to reciprocate within a cylinder body. The BLS module includes: a magnet fixed to a guide hole formed in the cylinder body in a lengthwise direction of the cylinder body; an actuating member coupled to the piston so as to be moved together with the piston as the piston is moved; a Hall sensor installed in the cylinder body at a location corresponding to the magnet for detect the magnetic flux density of the magnet; and a shielding member slidably provided in the guide hole and moved by the actuating member for shielding the Hall sensor from the magnet.

8 Claims, 6 Drawing Sheets

BRAKE MASTER CYLINDER FOR STABLY DETECTING MAGNETIC FLUX DENSITY

CROSS-REFERENCE TO RELATED APPLICATION

This application claims priority from and the benefit under 35 U.S.C. §119(a) of Korean Patent Application No. 10-2014-0137628, filed on Oct. 13, 2014, which is hereby incorporated by reference for all purposes as if fully set forth herein.

BACKGROUND OF THE INVENTION

1. Field of the Invention

The present invention relates to a brake master cylinder, and more particularly to a brake master cylinder that controls switching on a brake lamp using a Hall sensor and a magnet that is installed in the master cylinder.

2. Description of the Prior Art

In general, the master cylinder of a vehicle's brake refers to an apparatus for receiving a force that is applied as a boosting force from a pressure difference between the vacuum and the atmosphere from a booster, converting the force into a hydraulic pressure, and transmitting the hydraulic pressure to a cylinder to generate a braking force.

The brake master cylinder is provided with a unit for detecting an operation of a piston as a result of a pedal effort to switch on or off the brake lamp. As an example, Korean Patent Application Publication No. 10-2009-0101566 and Korean Patent No. 10-1085801 disclose master cylinders that switch on a brake lamp using a Hall sensor.

A conventional brake master cylinder includes a ring-shaped magnet installed in a piston that is slid and moved by a pedal effort, and a Hall sensor that is installed in a cylinder body of the master cylinder at a location corresponding to the magnet such that the piston may be moved forwards and rearwards in the cylinder body. The Hall sensor detects the strength of a magnetic force that due to the movement of the magnet that is installed in the piston to switch on the brake lamp.

Generally, the ring-shaped magnet installed in the piston has a high magnetic flux density, and a rare earth magnet formed, for example, of neodymium and samarium, which can be easily miniaturized is used as the ring-shaped magnet. However, in recent years, due to the sudden rise of the price of rare earth, the price of the rare earth magnet that is formed of the rare earth also has risen and thus the development of a replaceable technology is urgent. In particular, in order to use a general magnet instead of a rare earth magnet, the volume of the magnet should become larger in order to increase magnetic flux density, and because the interior of the master cylinder is a limited space, it is difficult to replace the rare earth magnet with a general magnet.

PRIOR TECHNICAL DOCUMENTS

Patent Documents (Patent Document 1) Patent Application Publication No. 10-2009-010556 (Mando Inc.) Sep. 29, 2009

(Patent Document 2) Patent No. 10-1085801 (Continental Tevez) Nov. 16, 2011

SUMMARY OF THE INVENTION

The present invention provides a master cylinder that: does not significantly increase the volume of the master cylinder; stably detects the magnetic flux density by moving a shielding member such that a change in magnetic flux may be generated between a magnet and a Hall sensor; and reduces the volume of the magnet.

In accordance with an aspect of the present invention, there is provided a brake master cylinder including a BLS module for controlling switching on of a brake lamp according to an operation of a piston provided to reciprocate within the cylinder body, wherein the BLS module includes: a magnet fixed to a guide hole formed in the cylinder body in a lengthwise direction of the cylinder body; an actuating member coupled to the piston so as to be moved together with the piston as the piston is moved; a Hall sensor installed in the cylinder body at a location corresponding to the magnet in order to detect the magnetic flux density of the magnet; and a shielding member slidably provided in the guide hole and moved by the actuating member in order to shield the Hall sensor from the magnet.

The BLS module may further include a resilient member provided in the guide hole for resiliently supporting the shielding member.

One end of the shielding member may be opened such that the magnet is accommodated in the shielding member when the magnet is moved by the actuating member.

The actuating member may include: a plate coupled to the piston; and a rod having a predetermined length, one end of which is coupled to the plate and an opposite end of which is inserted into the guide hole to be coupled to the shielding member.

A ball member for closing one end of the guide hole may be installed in the guide hole on an opposite side from the side on which the rod is inserted.

A plug member for closing one end of the guide hole may be coupled to the guide hole on a side that is opposite to the side on which the rod is inserted, and a fixing member coupled to or integrally formed with the plug member, for fixing the magnet may be provided.

The actuating member may include: a plate coupled to the piston; and a rod, one end of which is provided with a support that is supported by the plate and an opposite end of which is inserted into the guide hole to be coupled to the shielding member, and the plate may include a flange arranged to be concentric to the first piston and protruding in a radial direction of the piston, and a coupling part bent from the flange and inserted into and mounted on the inner side of the first piston, and the flange may support the support in order to slide the rod when the piston is operated.

The Hall sensor may be provided in the Hall sensor assembly, and the Hall sensor assembly may be coupled to an outside of the cylinder body.

According to an embodiment of the present invention, a guide hole is formed in a brake master cylinder such that a general magnet that is inexpensive may be moved forwards and rearwards, and a Hall sensor is provided at a location corresponding to the magnet so that manufacturing costs can be reduced while the sensitivity of the master cylinder is increased. That is, the sensitivity of the master cylinder can be increased even though a general magnet that has a low magnetic flux density is used, by minimizing the gap between the magnet and the Hall sensor, and costs can be reduced as well.

Furthermore, a change in magnetic flux can be stably M detected by providing a shielding member that is moved between the magnet and the Hall sensor as the piston moves to shield a magnetic flux. Then, because the size of the magnet can be reduced as compared with the related art while the magnet is fixed at a location facing the Hall sensor, manufacturing costs can be reduced.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE EXEMPLARY EMBODIMENTS

Hereinafter, exemplary embodiments of the present invention will be described in detail with reference to the accompanying drawings. The following embodiments are provided to fully transfer the idea of the present invention to those skilled in the art to which the present invention belongs. The present invention are not limited to the embodiments presented herein, and may be embodied in other forms. In the drawings, parts having no relevance to the description may be omitted to make the present invention clear, and the representation of elements may be somewhat exaggerated in size to help the understanding of the present invention.

Figure 1:
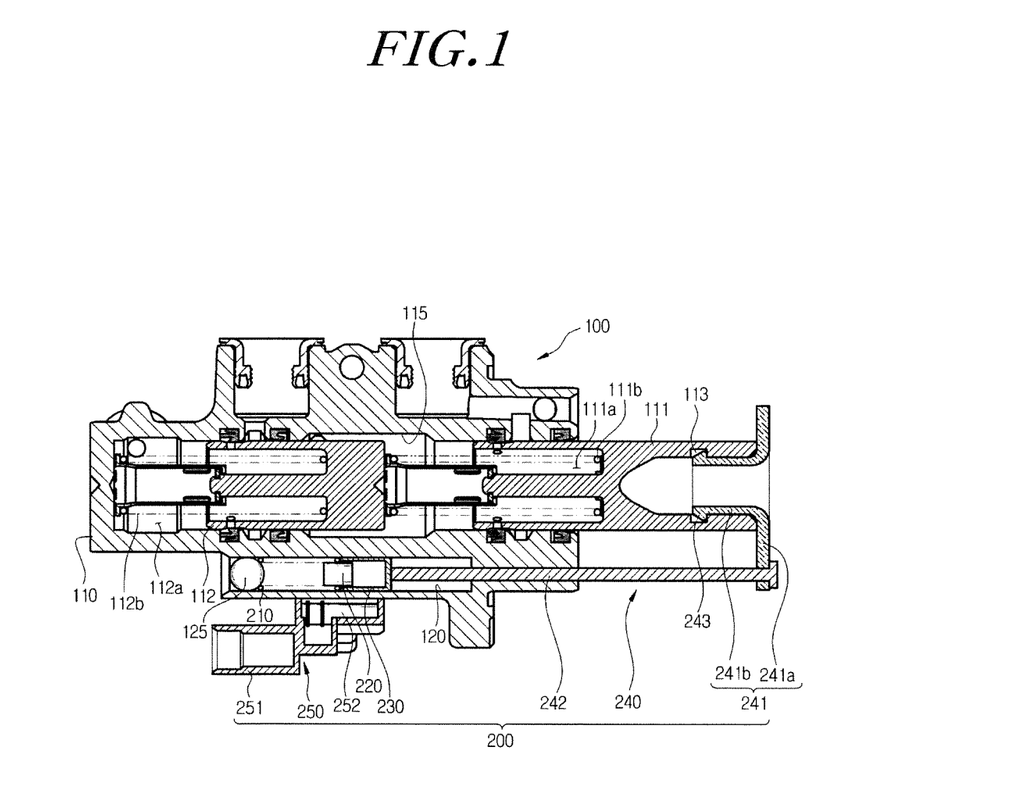
FIG. 1 is a sectional view illustrating a brake master cylinder according to an embodiment of the present invention.
Figure 2:
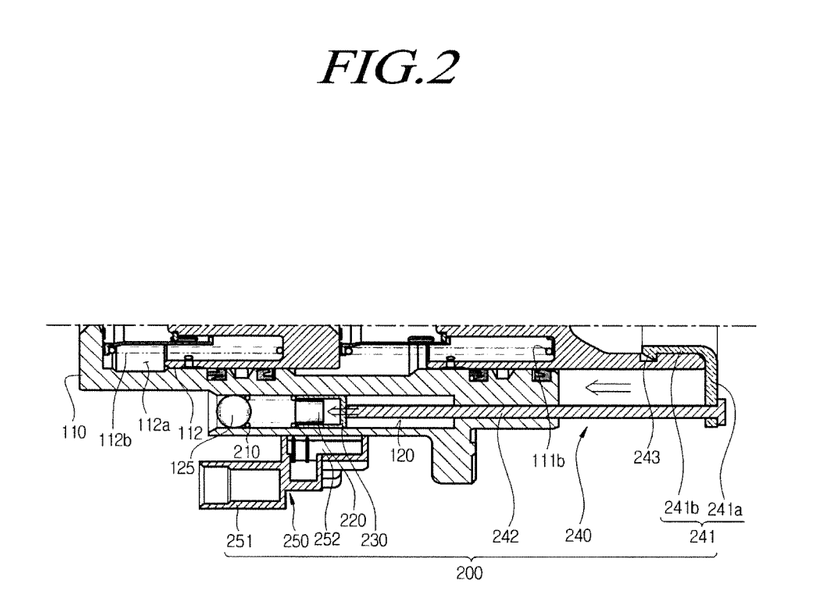
FIG. 2 is a sectional view illustrating an operational state of the brake master cylinder according to the embodiment of the present invention.
Figure 3:
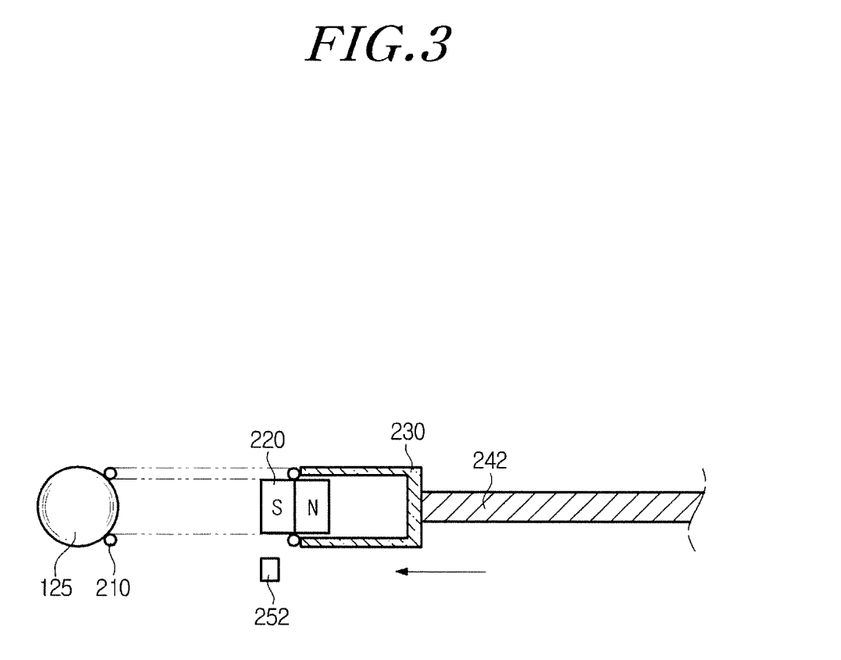
FIGS. 3 and 4 are views illustrating an operation of a BLS module provided in the brake master cylinder according to the embodiment of the present invention.
Figure 4:
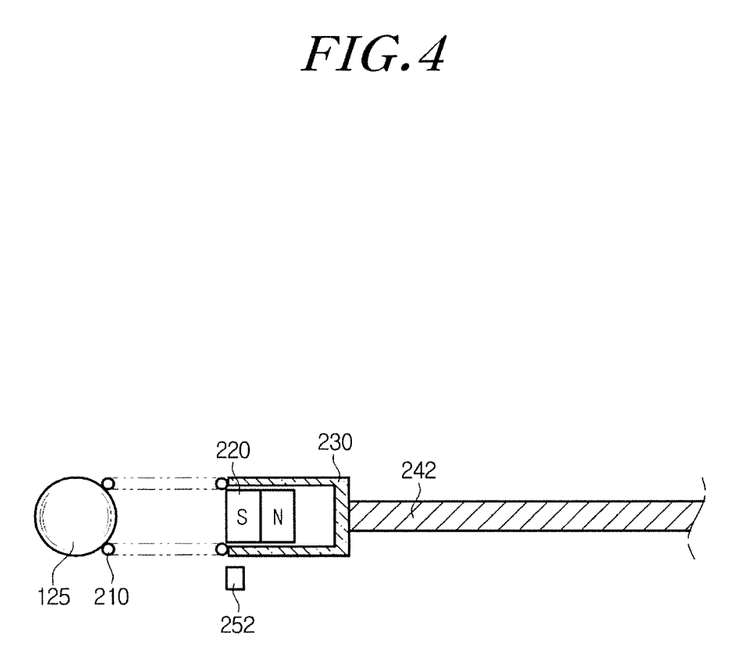
Figure 5:
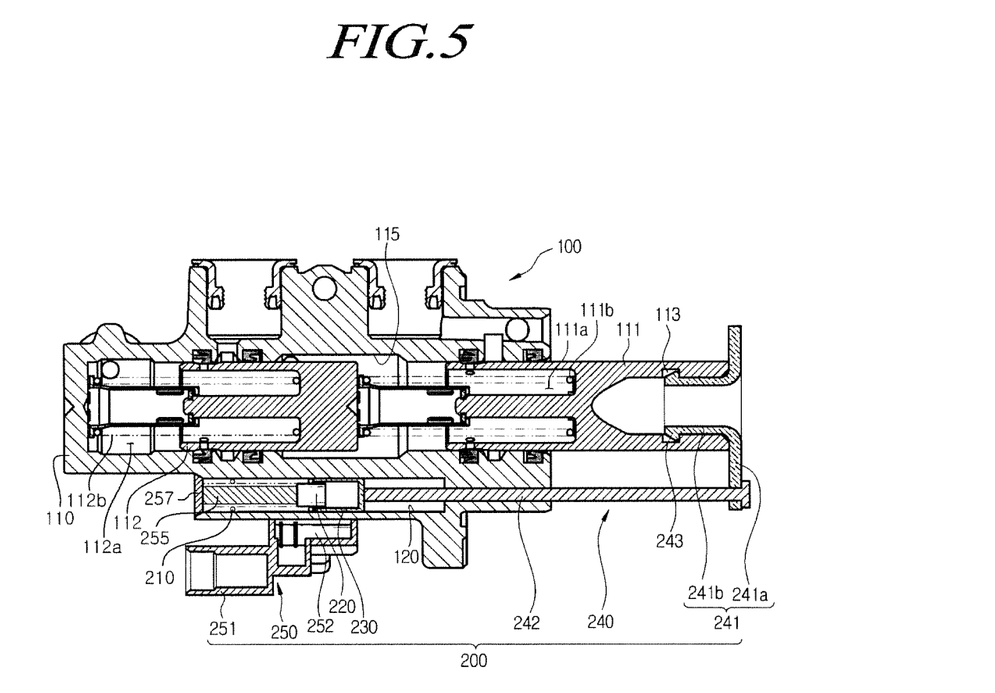
FIGS. 5 and 6 are sectional views illustrating a brake master cylinder according to an embodiment of the present invention.
Figure 6:
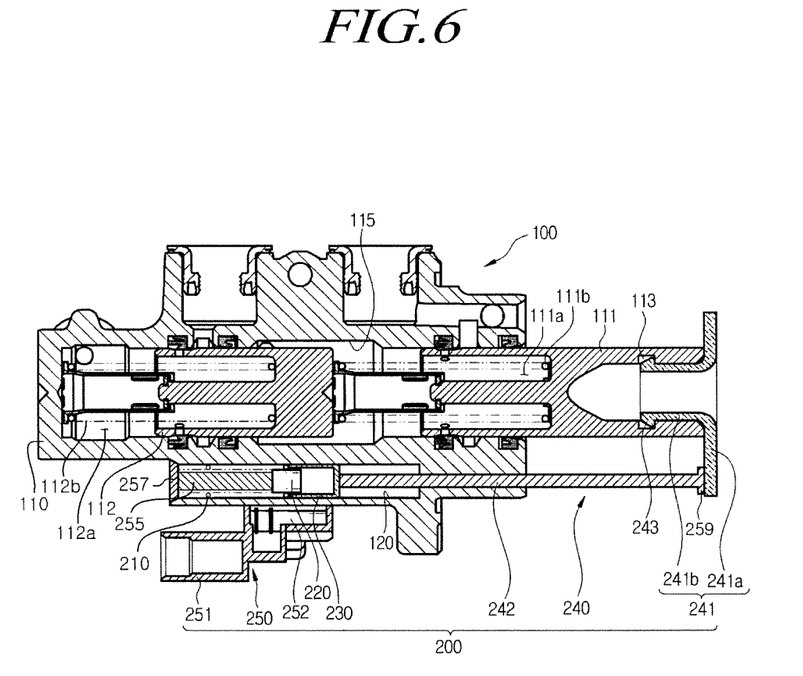

FIG. 1 is a sectional view illustrating a brake master cylinder according to an embodiment of the present invention. FIG. 2 is a sectional view illustrating an operational state of the brake master cylinder. FIGS. 3 and 4 are views illustrating an operation of a BLS module provided in the brake master cylinder. FIGS. 5 and 6 are sectional views illustrating a brake master cylinder according to an embodiment of the present invention.

Referring to FIGS. 1 to 4, a master cylinder 100 according to an embodiment of the present invention includes a cylinder body 110 having a hollow portion 115, pistons 111 and 112 provided to reciprocate in the hollow portion 115 of the cylinder body 110, and a Brake Light Sensor (BLS) module 200 installed in the cylinder body 110 for detecting reciprocal movement of the pistons 111 and 112 and controlling the switching on of a brake lamp. Then, the pistons 111 and 112 include first and second pistons 111 and 112.

The BLS module 200 includes a magnet fixed to a guide hole 120 formed in the cylinder body 110, a Hall sensor assembly 250 installed outside the master cylinder 100 for detecting a magnetic force of the magnet 220, an actuating member 240 coupled to the first piston 111 to be moved together with the first piston 111, a shielding member 230 moved by the actuating member 240, for shielding the Hall sensor assembly from the magnet 220, and a resilient member 210 for providing the shielding member 230 with a resilient force.

In more detail, one end of the cylinder body 110 is opened and an opposite end thereof has a closed cylindrical shape, and the pistons 111 and 112 that provided in the cylinder body 110 to be slid forwards and rearwards according to an operation of the brake pedal (not illustrated) of the driver include first and second pistons 111 and 112.

A reservoir tank (not illustrated) in which oil is stored such that the oil may be supplied to the master cylinder 100 is installed at an upper portion of the brake master cylinder 100. In the master cylinder 100, a pressure difference due to an operation of an input shaft (not illustrated) associated with the brake pedal (not illustrated) is transferred to an output shaft (not illustrated), and the output shaft pushes the first and second pistons 111 and 112 of the master cylinder 100 such that the hydraulic pressure is transferred to the wheel cylinders (not illustrated) of the wheels in order to generate a braking force.

A first liquid pressure chamber 111a, which is a space in which a liquid pressure is formed, is formed between the first piston ill and the second piston 112 in the interior of the cylinder body 110, and a second liquid pressure chamber 112a that is a space in which a liquid pressure is formed is formed between the second piston 112 and an inner wall of an opposite end of the cylinder body 110. A first return spring 111b and a second return spring 112b for returning the first piston 111 and the second piston 112, respectively, are provided in the liquid pressure chambers 111a and 112a.

A guide hole 120 formed in the lengthwise direction of the cylinder body 110 is formed in the cylinder body 110. As illustrated, the guide hole 120 is spaced apart from the hollow portion 115 by a predetermined interval, and is formed at a lower end of the cylinder body 110 to be parallel to the hollow portion 115. A magnet 220, which will be described below, and a rod of the actuating member 240 are slidably inserted into the guide hole 120.

As illustrated in FIGS. 1 to 4, the guide hole 120 at a side that is opposite to the side on which the rod 242 of the actuating member 240 is closed by a ball member 125, or as illustrated in FIGS. 5 and 6, a plug member 257 for closing one end of the guide hole 120 may be coupled to the end of the guide hole 120, and a fixing member 255 that is coupled to or integrally formed with the plug member 257 to fix the magnet 220 may be provided.

According to an embodiment of the present invention, an actuating member 240 for moving the shielding member 230 to control the switching on of the brake lamp according to forward and rearward movement of the pistons 111 and 112 is installed in the first piston 111, and a Hall sensor assembly 250 is installed in the cylinder body 110 at a location corresponding to the magnet 220.

As illustrated in FIGS. 1 to 4, the magnet 220 may be fixed to the guide hole 120 formed in the lengthwise direction of the cylinder body 110. Then, as the shielding member 230 is moved between the magnet 220 and the Hall sensor assembly 250 by the shielding member 230, which will be described below, at least the magnet 220 should be fixed after being separated from the lower end of the guide hole 120 by a predetermined interval.

As illustrated in FIGS. 5 and 6, the magnet 220 may be fixed by the fixing member 255, and the resilient member 210 is inserted into and coupled to an outer periphery of the fixing member 255 and one end of the guide hole 120 is closed by the plug member 257. Here, the plug member 257 and the fixing member 255 may be coupled to or integrally formed with each other.

The magnet 220 may be a rare earth magnet formed of, for example, of neodymium or samarium, which has a high magnetic flux density. This is because costs can be reduced by minimizing the size of the magnet 220 as the magnet 220 is fixed to a location facing the Hall sensor 252. A general magnet, such as a ferrite magnet or an Alnico magnet, which has a low magnetic flux density and is inexpensive, may be used as the magnet 220 so that costs can be reduced. Then, even though a general magnet has a low magnetic flux density, a magnetic flux displacement is generated by a separate shielding member 230 while the magnet 220 and the Hall sensor 252 are fixed so that the magnet 220 may be precisely and firmly detected.

Meanwhile, the S pole of the magnet 220 is located on the front side in correspondence with the Hall sensor 252 and the N pole of the magnet 220 is located on the rear side. Then, when the Hall sensor 252 is a sensor for detecting the N pole or a sensor for detecting the opposite poles, the present invention may be suitably modified and corrected by those skilled in the art. In the actual fields, Hall sensors for detecting the S pole are mostly used.

As described above, the actuating member 240 performs the function of moving the shielding member 230 as the pistons 111 and 112 are moved. In more detail, the actuating member 240 includes a plate 241 that is coupled to the first piston 111, and a rod 242 having a predetermined length, and coupled to the plate 241 and inserted into the guide hole 120 of the cylinder body 110.

The plate 241 is coupled to the first piston 111 on the front surface facing an output shaft (not illustrated) that pushes the first piston 111 with the pedal effort of the brake pedal (not illustrated). The plate 241 includes a flange 241a, which is arranged to be concentric to the first piston 111 and protrudes in a radial direction of the piston 111, and a coupling part 241b bent from the flange 241a and inserted into and mounted on the inner side of the first piston 111. Then, a concave stopper recess 113 is formed on an inner side of the first piston 111, and a stopper step 243 inserted into the stopper recess 113 is formed at the coupling part 241b at a corresponding location.

The rod 242 may be integrally coupled to the flange 241a of the plate 241 such that it is arranged in parallel to the first piston 111 in the lengthwise direction of the cylinder body 110 to interwork with the first piston 111, or may be provided with a support 259 at one end thereof to be supported by the plate 242 as illustrated in FIG. 6.

That is, as illustrated in FIG. 6, when the first piston 111 is operated, the flange 241a may support the support 259 to slide the rod together with the first piston 111, and may return to the original position by the resilient member 210.

The rod 242 has a predetermined length, and a portion of the rod 242 is inserted into the guide hole 120 of the cylinder body 110. Then, the rod 242 may be integrally formed with the plate 241. An end of the rod 242 coupled to the plate 241 is coupled to the shielding member 230.

The shielding member 230 is slidably provided in the guide hole 120. The shielding member 230 is moved by the actuating member 240 to perform a function of shielding the magnetic force generated between the magnet 220 and the Hall sensor 252, and may be formed of steel. In more detail, one end of the shielding member 230 is opened such that the magnet 220 is accommodated in the shielding member 230 when the magnet 220 is pushed by the rod 242. Then, although it is illustrated that the shielding member 230 surrounds the magnet 220, the present invention is not limited thereto and the shielding member 230 may be provided in the form of a plate that is moved between the magnet 220 and the Hall sensor 252. Furthermore, although it has been described that the shielding member 230 is coupled to the rod 242 of the actuating member 240, the present invention is not limited thereto and the shielding member 230 may be pushed and moved while making contact with the rod 242. Accordingly, a resilient member 210 that returns the shielding member 230 to the original position is provided on an opposite side of the shielding member 230 in contact with the rod 242.

The resilient member 210 is provided in the guide hole 120 and resiliently supports the shielding member 230. One end of the resilient member 210 is supported by a ball member 125 and an opposite end thereof is supported by the shielding member 230. The resilient member 210 includes a coil spring.

The Hall sensor assembly 250 is fixedly installed on an outside of the cylinder body 110. The Hall sensor assembly 250 includes a sensor housing 251 in which a bracket (not illustrated) for coupling the assembly to the cylinder body 110 is formed, and a Hall sensor (a magnetic detection element) 252 installed within the sensor housing 251 to detect a change in the magnetic flux density with the magnet 220 and controls the switching on of the brake lamp. Then, the sensor housing 251 may be easily attached to and detached from the cylinder body 110 as it is coupled to an outer side of the cylinder body 110 by a bolt (not illustrated) or the like, and the Hall sensor 252 is installed to correspond to the location of the magnet 220.

As described above, the guide hole 120 is formed at a location spaced in the radial direction of the cylinder body 110, and the magnet 220 may be fixed to the guide hole 120 and the Hall sensor 252 may be installed at a location corresponding to the magnet 220 in order to minimize the size of the magnet at the same time. Furthermore, even when a general magnet, such as a ferrite magnet or an alnico magnet, which is inexpensive, is used, a high precision can be guaranteed. Because the master cylinder 100 can be used as long as the distance between the guide hole 120 and the Hall sensor 252 endures a vacuum pressure even though the master cylinder 100 should have a predetermined thickness to endure the liquid pressure that is generated in the master cylinder 100, the size of the magnet can be reduced by minimizing the interval between the Hall sensor 252 and the magnet 220, or a high precision can be guaranteed even though a general magnet that has a low magnetic flux density is used.

Hereinafter, an operational state of the BLS module due to an operation of the brake master cylinder that has the above-mentioned structure will be described with reference to the accompanying drawings.

First, if the brake pedal (not illustrated) is pushed when the driver brakes the vehicle, the first piston 111 of the master cylinder 100 is moved forwards according to a required pedal effort of the booster or the pedal detection sensor. If the first piston 111 is moved forwards, the oil in the closed first liquid pressure chamber 111a is compressed, and the oil in the second liquid pressure chamber 112a is compressed while the second piston 112 is moved in conjunction with the first piston 111. The first return spring 111b and the second return spring 112b provided in front of the first piston 111 and the second piston 112, respectively are compressed if force is applied to the brake pedal, and if the force applied to the brake pedal is released, the first and second pistons 111 and 112 return to the original positions by the resilient restoring force.

When the first and second pistons 111 and 112 are moved forwards and rearwards, the Hall sensor assembly 250 installed outside the cylinder body 110 detects movement of the first and second pistons 111 and 112. That is, if the first pistons 111 is moved forwards, the plate 241 and the rod 242 coupled to the first piston 111 are moved together, and accordingly, the shielding member 230 arranged in the guide hole 120 is moved. Then, the shielding member 230 shields a magnetic force while compressing the resilient member 210 and moving between the magnet 220 fixed to the guide hole 120 and the Hall sensor 252.

Accordingly, because a magnetic flux applied to the Hall sensor 252 that detects a magnetic flux is reduced, the Hall sensor assembly 250 that detected the reduced magnetic flux switches on the brake lamp.

In contrast, when the first and second pistons 111 and 112 return to the original positions, that is, the shielding member 230 opens a space between the Hall sensor 252 and the magnet 220, the brake lamp is switched off as the magnetic flux applied to the Hall sensor 252 increases. In particular, according to the embodiment of the present invention, because the magnetic flux density can be significantly increased by minimizing the spacing between the magnet 220 and the Hall sensor 252, the size of the magnet can be minimized and a high precision can be guaranteed even though a general magnet is used.

Although the present invention has been described above in conjunction with the limited embodiments and drawings, the present invention is not limited thereto, and it will be apparent that various modifications and changes may be made by those skilled in the art within the scope equivalent to the technical idea of the present invention and the appended claims.

What is claimed is:

1. A brake master cylinder comprising a BLS module for controlling the switching on of a brake lamp according to an operation of a piston provided to reciprocate within a cylinder body, wherein the BLS module comprises:
    a hollow portion formed in the cylinder body at a middle portion of the cylinder body in a lengthwise direction of the cylinder;
    a guide hole formed in the cylinder body at a lower portion of the cylinder body below the hollow portion in the lengthwise direction of the cylinder body;
    a magnet disposed inside the guide hole so that the magnet slides in the lengthwise direction of the cylinder body inside the guide hole;
    an actuating member connected to an end of the piston so as to be moved together with the piston as the piston is moved in the hollow portion of the cylinder;
    a Hall sensor installed in the cylinder body at a location corresponding to the magnet for detecting a magnetic flux density of the magnet; and
    a shielding member disposed inside the guide hole and sliding by the actuating member for shielding the Hall sensor from the magnet.

2. The brake master cylinder of claim 1, wherein the BLS module further comprises a resilient member provided in the guide hole for resiliently supporting the shielding member.

3. The brake master cylinder of claim 1, wherein one end of the shielding member is opened such that the magnet is accommodated in the shielding member when the shielding member is moved by the actuating member.

4. The brake master cylinder of claim 1, wherein the actuating member comprises:
    a plate coupled to the piston; and
    a rod that has a predetermined length, one end of which is coupled to the plate and an opposite end of which is inserted into the guide hole to be coupled to the shielding member.

5. The brake master cylinder of claim 4, wherein a ball member for closing one end of the guide hole is installed in the guide hole on the side that is opposite to the side on which the rod is inserted.

6. The brake master cylinder of claim 4, wherein a plug member for closing one end of the guide hole is coupled to the guide hole on the side that is opposite to the side on which the rod is inserted, and a fixing member coupled to or integrally formed with the plug member for fixing the magnet is provided.

7. The brake master cylinder of claim 1, wherein the actuating member comprises:
    a plate coupled to the piston; and
    a rod, one end of which is provided with a support that is supported by the plate and an opposite end of which is inserted into the guide hole to be coupled to the shielding member, and
    wherein the plate includes a flange arranged to be concentric to the first piston and protruding in a radial direction of the piston, and a coupling part bent from the flange and inserted into and mounted on the inner side of the first piston, and the flange supports the support to slide the rod when the piston is operated.

8. The brake master cylinder of claim 1, wherein the Hall sensor is provided in a Hall sensor assembly, and the Hall sensor assembly is coupled to the outside of the cylinder body.

* * * * *